US012658241B2

(12) United States Patent
Lu et al.

(10) Patent No.: US 12,658,241 B2
(45) Date of Patent: Jun. 16, 2026

(54) APPARATUSES AND METHODS FOR SINGLE AND MULTI MEMORY CELL ARCHITECTURES

(71) Applicant: Micron Technology, Inc., Boise, ID (US)

(72) Inventors: Yang Lu, Boise, ID (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 18/746,226

(22) Filed: Jun. 18, 2024

(65) Prior Publication Data

US 2025/0118351 A1    Apr. 10, 2025

Related U.S. Application Data

(60) Provisional application No. 63/588,907, filed on Oct. 9, 2023.

(51) Int. Cl.
*G11C 11/4091* (2006.01)
*G11C 11/4093* (2006.01)

(52) U.S. Cl.
CPC ...... *G11C 11/4091* (2013.01); *G11C 11/4093* (2013.01)

(58) Field of Classification Search
CPC ........................ G11C 11/4091; G11C 11/4093
USPC ................................................... 365/230.01
See application file for complete search history.

(56) References Cited

U.S. PATENT DOCUMENTS

| | | | |
|---|---|---|---|
| 5,418,737 A | 5/1995 | Tran | |
| 5,638,317 A | 6/1997 | Tran | |
| 5,648,927 A | 7/1997 | Tran | |
| 7,164,595 B1 | 1/2007 | Shore et al. | |
| 9,583,209 B1 | 2/2017 | Roy et al. | |
| 10,770,127 B2 * | 9/2020 | Shore ................... | G11C 11/408 |
| 11,462,291 B2 | 10/2022 | Pan | |
| 11,545,205 B2 | 1/2023 | Vimercati | |
| 11,837,276 B2 | 12/2023 | Takahashi et al. | |

(Continued)

FOREIGN PATENT DOCUMENTS

| | | |
|---|---|---|
| JP | 2015052940 A | 3/2015 |
| KR | 20010026103 A | 4/2001 |

OTHER PUBLICATIONS

U.S. Appl. No. 18/746, 339 titled "Apparatuses and Methods for Single and Multi Memory Cell Architectures" filed Jun. 18, 2024, pp. all pages of the application as filed2.

(Continued)

*Primary Examiner* — Anthan Tran
(74) *Attorney, Agent, or Firm* — Dorsey & Whitney LLP

(57) ABSTRACT

Single (1T) and multi (MT) memory cell architectures may be included in a same memory array. In some embodiments, the individual memory cells of the MT memory cells may have a same polarity. In some embodiments, the individual memory cells of the MT memory cells may have complementary polarity. In some examples, digit lines at memory mats and edge memory mats may be folded for MT memory cells. In some examples, digit lines may be rerouted through local input-output line breaks for the MT memory cells. In some examples, the LIO lines from the MT memory cells may be twisted. In some examples, larger sense amplifiers may be used for the MT memory cells.

10 Claims, 7 Drawing Sheets

(56) References Cited

U.S. PATENT DOCUMENTS

| | | | |
|---|---|---|---|
| 2002/0000837 | A1 | 1/2002 | Keeth et al. |
| 2002/0149961 | A1* | 10/2002 | Shirahama ............. G11C 7/065 |
| | | | 365/149 |
| 2012/0039144 | A1 | 2/2012 | Tobori et al. |
| 2015/0364178 | A1* | 12/2015 | Kim .................... G11C 11/1653 |
| | | | 365/158 |
| 2021/0272620 | A1 | 9/2021 | Barry |
| 2023/0186971 | A1 | 6/2023 | Takahashi et al. |
| 2023/0352073 | A1 | 11/2023 | Visconti et al. |
| 2025/0118352 | A1 | 4/2025 | Lu et al. |
| 2025/0118353 | A1 | 4/2025 | Lu et al. |
| 2025/0118358 | A1 | 4/2025 | Lu et al. |

OTHER PUBLICATIONS

U.S. Appl. No. 18/746,447 titled "Apparatuses and Methods for Single and Multi Memory Cell Architectures" filed Jun. 18, 2024, pp. all pages of the application as filed.
U.S. Appl. No. 18/746,473 titled "Apparatuses and Methods for Single and Multi Memory Cell Architectures" filed Jun. 18, 2024 pp. all pages of the application as filed.

* cited by examiner

APPARATUSES AND METHODS FOR SINGLE AND MULTI MEMORY CELL ARCHITECTURES

CROSS REFERENCE TO RELATED APPLICATION(S)

This application claims the benefit under 35 U.S.C. § 119 of the earlier filing date of U.S. Provisional Application Ser. No. 63/588,907 filed Oct. 9, 2023 the entire contents of which is hereby incorporated by reference in its entirety for any purpose.

BACKGROUND

Information may be stored on memory cells of a memory device. The memory cells may be organized at the intersection of word lines (rows) and bit lines (columns). During an access operation, a word line may be activated and data may be read out from the memory cells along the bit lines to sense amplifiers, which may detect the information stored in the memory cells. The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto refresh operation may be carried out where a sequence of memory cells are periodically refreshed. Repeated access to a particular memory cell or group of memory cells (often referred to as a 'row hammer' attack) may cause an increased rate of data degradation in nearby memory cells. Memories may include circuitry for tracking the number of accesses and/or length of access time for each row, for example, as described in U.S. Pat. Nos. 10,770,127 and 11,462,291, which are incorporated herein by reference for any purpose. However, writing a count value representing the number of accesses and/or length of access time to the memory may require additional time that may degrade performance of the memory. Accordingly, minimizing the timing impacts of access tracking are desired.

DETAILED DESCRIPTION

Figure 1:
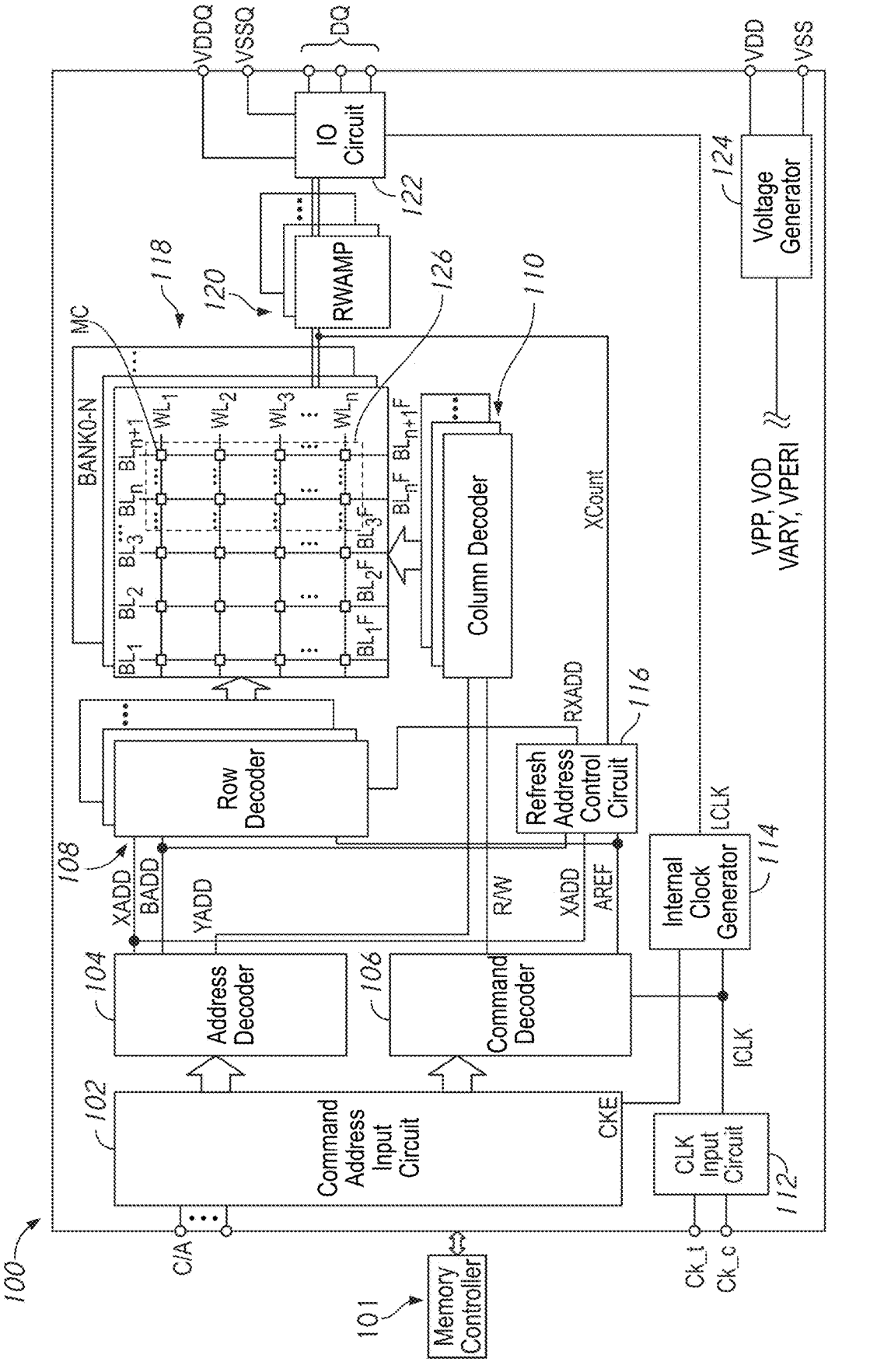
FIG. 1 is a block diagram of a semiconductor device according to at least one embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a memory array may be accessed by one or more access operations, such as read or write operations. During a read operation, a word line is activated, and data is read out from the memory cells along that word line along the bit lines coupled to those respective memory cells. Sense amplifiers coupled to the bit lines detect if the voltage along the bit line represents a logical high or logical low, and drives the voltage along the bit line to an appropriate voltage level. One or more bit lines can then be coupled to respective local input/output (I/O) lines (e.g., LIO lines) to read out the voltage on the bit line. Similarly, during a write operation, bit lines may be coupled to LIO lines and the sense amplifiers (SA) may provide that data along the bit lines to be written to the memory cells. It takes time for the memory to access the memory cells along a given word line. In some applications, it may be useful for different memory cells to have different access speeds. One of the limiting factors which determines access speed may be the time it takes to sense the relatively small voltages produced by the charge stored in a single memory cell.

Memory devices may have mixed memory cell architectures. A given word line may have a number of memory cells along it. Along one portion, each memory cell may be coupled to a separate sense amplifier along a respective bit line, which may be referred to as a 1T architecture. In some embodiments, individual memory cells may store a bit. In another, each sense amplifier is coupled to more than one memory cell (e.g., two or more), which may be referred to as a MT architecture, where M is a whole number greater than one. In the MT architecture, multiple memory cells are used to store a bit (e.g., two memory cells may be used to store one bit). The MT architecture may have increased access speed compared to the 1T architecture, since the two memory cells both contribute charge to the voltage read by the sense amplifier. Various implementations of mixed memory cell architectures have been described, for example, U.S. patent application Ser. No. 17/186,797, U.S. patent application Ser. No. 17/732,885, U.S. patent application Ser. No. 17/551,095, and U.S. Pat. No. 11,545,205, which are incorporated herein by reference for any purpose.

An example application that may use such an architecture is a memory in which an access count associated with each row is stored in memory cells of that row. Repeated accesses to a word line of the memory (e.g., a "row hammer" attack)

may cause an increased rate of memory degradation in the memory cells of nearby word lines. To mitigate this, the memory may store an access count associated with each row along designated counter memory cells along that row. Since those counter memory cells must undergo a read-modify-write cycle with each access operation (e.g., to read the count, update it, and then write the updated count back to the counter memory cells), it may be useful for those counter memory cells operate with faster timing than the memory cells of the rest of the word line. Accordingly, the counter memory cells may use a MT architecture, while the rest of the memory cells along the word line may use a 1T architecture. An example implementation for this application is described in the previously mentioned '095 application.

While using MT architecture for memory cells dedicated to storing an access count for a row may reduce the time required for reading and/or writing the access count, implementing MT architectures, and particularly implementing mixed 1T and MT architectures in a same array raises process and layout issues. For example, it may be desirable for the 1T and MT cells to be of a same physical type to avoid requiring different portions of the array to be fabricated by different processes. However, having memory cells of a same type may require the 1T and MT cells to be coupled to other components (e.g., LIO, SA, bit lines, etc.) differently. This may require changes to the layout of conductive lines and/or increases in the number of conductive lines, which in turn may increase a layout area of the array.

The present disclosure provides various techniques for incorporating both 1T and MT memory cells in a memory array. In some embodiments, the techniques may not require different processes for the different regions. In some embodiments, the individual memory cells of the MT memory cells may have a same polarity. In some embodiments, the individual memory cells of the MT memory cells may have complementary (e.g., opposite) polarity. By same polarity, it is meant that all memory cells hold a charge associated with a same logic value in the 1T region (e.g., two or more memory cells store charges associated with '1' or '0' to encode a '1' or '0' bit). By complementary polarity, it is meant the memory cells hold charges associated with different logic values in the 1T region, and the combination is used to encode a bit. For example, a first memory cell may store a charge associated with '1' and a second memory cell may store a charge associated with '0' to encode a '1' and the first memory cell may store a charge associated with a '0' and the second memory cell may store a charge associated with a '1' to encode a '0.'

In some embodiments, bit lines at memory mats and edge memory mats may be folded for MT memory cells. In some embodiments bit lines may be rerouted through local input-output (LIO) line breaks for the MT memory cells. In some embodiments, the LIO lines from the MT memory cells may be twisted. In some embodiments, larger sense amplifiers may be used for the MT memory cells. The various embodiments may provide MT memory cells with reduced access times compared to 1T cells. Which embodiment is preferable may be based on various factors including, but not limited to available layout space, available fabrication precision, and layout of other components of the memory array, or a combination of factors.

While many of the examples disclosed herein illustrate a 2T architecture for the MT portion of the array, the disclosure is not limited to 2T, and the principles of the present disclosure may be extended to other architectures (e.g., 2T, 3T, 4T, 6T). Further, while examples disclosed herein refer to the MT cells used as counter cells for tracking row accesses, the MT cells may be used for other purposes (e.g., metadata, error correction code data).

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks BANK0-BANKN. In some embodiments, the memory array 118 may include eight or sixteen banks, but more or fewer banks may be included in the memory array 118 of other embodiments. Each memory bank includes a plurality of word lines WL (rows), a plurality of bit lines BL (columns), and a plurality of memory cells MC arranged at intersections of the plurality of word lines WL and the plurality of bit lines BL. Some of the memory cells MC along the word lines may be MT memory cells 126. The MT memory cells 126 may be similar to the other memory cells (e.g., 1T memory cells) of the memory array 118, except that the MT memory cells 126 are organized such that multiple memory cells are coupled together to store the same bit. For example, two MT memory cells 126 may have bit lines which are shorted together. Other arrangements of linking MT memory cells 126 may be used in other example embodiments.

In some embodiments, the memory device 100 may use the MT memory cells 126 to store a count value XCount associated a number of accesses to the word line. For example, the memory cells along the MT memory cells 126 may be used to store bits of a number, XCount, and the memory cells along the MT memory cells 126 may be counter memory cells. For example, if the number XCount is an N bit binary number, then there may be MN memory cells 126 along the MT region, shorted together to store N bits. A data bus associated with the MT memory cells 126 may be coupled to the refresh address control circuit 116. However, in other embodiments where the MT memory cells 126 are used to store different information (e.g., metadata) instead of a count value XCount, the data bus associated with the MT memory cells 126 may be coupled to another component of the memory device 100. In some embodiments, the data bus associated with the counter memory cells 126 may be separate from the data bus which couples the other memory cells to the IO circuit 122. In some embodiments, the count value XCount may be made available to both the refresh address control circuit 116 and the IO circuit 122.

The selection of the word line WL is performed by a row decoder 108 and the selection of the bit lines BL/BLF is performed by a column decoder 110. In the embodiment of FIG. 1, the row decoder 108 includes a respective row decoder for each memory bank and the column decoder 110 includes a respective column decoder for each memory bank. The bit lines BL/BLF are coupled to a respective sense amplifier (not shown in FIG. 1). Read data from the bit line BL//BLF is amplified by the sense amplifier, and transferred to read/write amplifiers 120 over complementary local data lines (LIO/F, not show in FIG. 1), transfer gate (TG) (not shown), and complementary main data lines (MIO/F) (not shown). Conversely, write data outputted from the read/write amplifiers 120 is transferred to the sense amplifier over the complementary main data lines MIO/F, the transfer gate TG, and the complementary local data lines LIO/F, and written in the memory cell MC coupled to the bit line BL. Information may generally be read from and written to the MT memory cells 126 in an analogous fashion. In embodiments, where the MT memory cells store a count value XCount, the data in the MT memory cells 126 are read and written by the refresh address control circuit 116.

The semiconductor device 100 may employ a plurality of external terminals that include command and address (C/A) terminals coupled to a command and address bus to receive commands and addresses, clock terminals to receive clocks Ck_t and Ck_c, data terminals DQ to provide data, and power supply terminals to receive power supply potentials VDD, VSS, VDDQ, and VSSQ. In some embodiments, certain signals, such as commands and addresses, clock signals, and/or data may be provided by a controller, such as memory controller 101.

The clock terminals are supplied with external clocks Ck_t and Ck_c that are provided to an input circuit 112. The external clocks may be complementary. The input circuit 112 generates an internal clock ICLK based on the Ck_t and Ck_c clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. The read command is received by the command decoder 106, which provides internal commands so that read data from the memory array 118 is provided to the read/write amplifiers 120. The read data is output to outside from the data terminals DQ via the input/output circuit 122. The access count XCount stored in the MT memory cells 126 of the row associated with the row address XADD are read to the refresh address control circuit 116, and an updated value of the access count XCount' is written back to the MT memory cells 126 of the row XADD.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. Similar to the read operation described above, the access count Xcount stored in the MT memory cells 126 of the row associated with the row address XADD are read to the refresh address control circuit 116, and an updated value of the access count Xcount' is written back to the MT memory cells 126 of the row XADD.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic.

The refresh address control circuit 116 may selectively output a targeted refresh address (e.g., a victim address) or an automatic refresh address (auto-refresh address) as the refreshing address RXADD. The automatic refresh addresses may be a sequence of addresses which are provided based on activations of the auto-refresh signal AREF. The refresh address control circuit 116 may cycle through the sequence of auto-refresh addresses at a rate determined by AREF. In some embodiments, the sequence of auto-refresh addresses may include all the addresses in the memory bank 118. In some embodiments, the auto-refresh signal AREF may be issued with a frequency such that most or all of the addresses in the memory bank 118 are refreshed within a certain period, which may be based on an expected rate at which information in the memory cells MC decays.

The refresh address control circuit 116 may also determine targeted refresh addresses which are addresses that require refreshing (e.g., victim addresses corresponding to victim rows) based on the access pattern of nearby addresses (e.g., aggressor addresses associated with aggressor rows) in the memory array 118. The refresh address control circuit 116 may monitor accesses to the different word lines WL of the memory bank. When the row decoder 108 sends an access command to a particular row, the MT memory cells 126 along that row may have their information read to the refresh address control circuit 116 as the access count Xcount. The refresh address control circuit 116 may determine an access count of the row based on the values stored in the MT memory cells 126 of the accessed row.

The refresh address control circuit 116 may determine if the accessed row is an aggressor row based on the access count from the MT memory cells 126. If the current row is not an aggressor row, the value of the access count may be changed and then the refresh address control circuit may write the new value of the access count back to the counter memory cells 126 of the accessed row. If the refresh address control circuit 116 determines that the accessed row is an aggressor, then the refresh address control circuit 116 may use the row address XADD of the accessed row to determine one or more victim row addresses and provide them as a refresh address RXADD as part of a targeted refresh operation. When the accessed row is determined to be an aggressor, the access count Xcount associated with that row may be reset (e.g., to a minimum value, such as 0). In some embodiments, the refresh address control circuit 116 may queue up identified aggressor addresses (e.g., in a register) for later use in targeted refresh operations.

The refresh address RXADD may be provided with a timing based on a timing of the refresh signal AREF. The refresh address control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 116 may determine whether to provide a targeted refresh address, not provide an address during that time slot, or provide an auto-refresh address instead during the time slot.

The targeted refresh address may be based on access characteristics over time of the row addresses XADD received from the address decoder 104. For example, the access characteristics may be determined based on the value of the access count Xcount stored in the MT memory cells 126. The refresh address control circuit 116 may use different methods to calculate a targeted refresh address based on a row address XADD identified as an aggressor address based on the access count. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
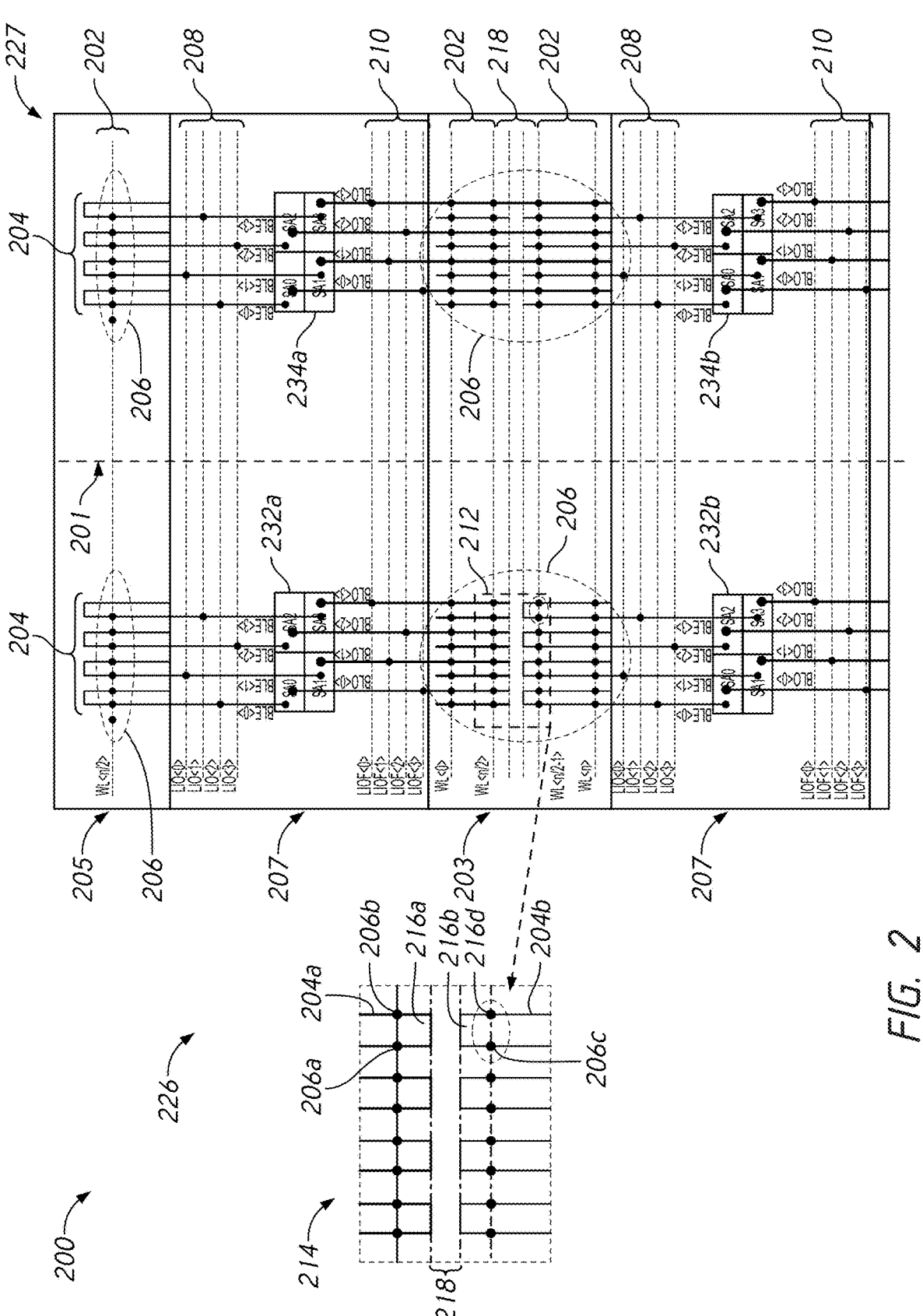
FIG. 2 is a schematic diagram of a portion of a memory array according to at least one embodiment of the present disclosure.

FIG. 2 is a schematic diagram of a portion of a memory array according to at least one embodiment of the present disclosure. The memory array 200 may represent an exemplary portion of a memory array, such as the memory array 118 of FIG. 1. The memory array 200 may be divided into mats (e.g., memory mats, memory array mats, array mats), including mat 203 (e.g., full array mat) and edge mat 205 (so called because it is at an edge of the memory array 200) separated by peripheral regions 207 that include sense amplifiers (SA) and LIO. The memory array 200 includes a plurality of word lines WL (rows) 202 and bit lines (BLE and BLO) (columns) 204. A plurality of memory cells 206 (MC), are located at the intersection of the rows and columns. A portion of the memory cells 206 along a given word line may be set up using a MT architecture, such as in MT region 226 on the left side (from the perspective of the reader) of line 201, while a remainder of the memory cells along the word line use a 1T architecture in region 227 on the right side of line 201. The memory cells 206 of both regions 226 and 227 may be generally similar or identical to each other, except they may be coupled differently as described herein. The memory array 200 includes a number of sense amplifier groups 232*a-b* and 234*a-b*, each of which includes a number of sense amplifiers SA0-3. The sense amplifier groups 232 and 234 may be generally similar to each other, except that the sense amplifier groups 234 are coupled to bit lines in the 1T region, and the sense amplifier groups 232 are coupled to bit lines in the MT region 226. The sense amplifier groups 232 and 234 may be coupled to local I/O lines LIO 208 and LIOF 210.

For clarity of illustration, only one edge array mat and only one full array mat are shown in FIG. 2. The memory array 200 may include multiple full array mats, with edge array mats at either end of the array. Further, only a few word lines WL and bit lines BL (and their corresponding memory cells 206) and their corresponding sense amplifiers and LIO are shown in FIG. 2. More word lines WL and bit lines BL (and their corresponding memory cells), sense amplifiers, and LIO may be provided in a memory cell array of the present disclosure.

Each of the memory cells 206 may store information. In some embodiments, the information may be stored as a binary code, and each memory cell 206 in the MT region may store a bit, while a pair of memory cells 206 in the MT region 226 may store a bit, which may be either at a logical high or a logical low level. In the example shown in FIG. 2, the pair of memory cells 206 in the MT region 226 may have a same polarity.

The sense amplifiers of sense amplifier groups 232 and 234 may read or write a value of a bit of information along the bit lines 204 to memory cells 206 at the accessed word line 206. The sense amplifiers of sense amplifier groups 232 and 234 may convert a signal along the bit line to a signal which is 'readable' by other elements of the memory device (e.g., by amplifying a voltage). The bit lines may be coupled to an input/output circuit (e.g., input/output circuit 122 of FIG. 1) via a respective column select switch, which may be a column select transistor activated by a column select signal CS. In the example shown in FIG. 2, each CS may access eight bits per word line 202 in region 227 and may access four bits per word line in region 226.

In an example read operation of region 227, when a word line 202 is accessed, the memory cells 206 may provide their charge onto the coupled bit lines 204 which may cause a change in a voltage and/or current along the bit line 204. The sense amplifiers of groups 234 may determine a logical level of the accessed memory cell 206 based on the resulting voltage and/or current along the bit line 204, and may provide a signal corresponding to the logical level through the column select transistor to the input/output circuit.

In an example write operation of region 227, the sense amplifiers SA0-3 of sense amplifier groups 234 may receive a signal indicating a logical level to be written to the accessed memory cells 206 from the input/output circuit. The sense amplifiers SA0-3 of sense amplifier groups 234 may provide a voltage and/or current along the coupled bit line 204 (e.g., along the bit lines with active column select transistors) at a level corresponding to the logical level to be written. The voltage and/or current along the bit line 204 may charge the memory cell 206 at the intersection of the bit line 204 with an accessed word line 202 to a charge level associated with the written logical level. In this manner, by specifying the row which is accessed, and which bit lines to record data from (and/or write data to), specific memory cells 202 may be accessed during one or more operations of the memory device.

Certain memory cells along each of the word lines may be set up as MT memory cells in region 226. In the example shown in FIG. 2, the MT memory cells have a 2T architecture. The 2T memory cells 206 in region 226 may generally be similar to the other, 1T, memory cells of region 227. In some embodiments, the 2T memory cells of region 226 may be physically the same as the other memory cells 206. However, rather than each sense amplifier SA0-3 of sense amplifier groups 232 being coupled to a single memory cell, in the 2T region, each sense amplifier SA0-3 of sense amplifier groups 232 is coupled to multiple memory cells (e.g., a pair of memory cells).

Referring to the full array mat 203 in region 226, bit line BLO<0> is coupled to SA0 of sense amplifier group 232a and two memory cells 206 in each of half of the word lines 202 of the full array mat 203. BLO<0> is further coupled to LIOF<3> associated with sense amplifier group 232a. Bit line BLO<1> is coupled to SA1 of sense amplifier group 232a and two memory cells 206 in each of half of the word lines 202 of the full array mat 203. BLO<1> is further coupled to LIOF<1> associated with sense amplifier group 232a. Bit line BLO<2> is coupled to SA2 of sense amplifier group 232a and two memory cells 206 in each of half of the word lines 202 of the full array mat 203. BLO<2> is further coupled to LIOF<2> associated with sense amplifier group 232a. Bit line BLO<3> is coupled to SA3 of sense amplifier group 232a and two memory cells 206 in each of half of the word lines 202 of the full array mat 203. BLO<3> is further coupled to LIOF<0> associated with sense amplifier group 232a.

Still referring to the full array mat 203 in the region 226, bit line BLE<0> is coupled to SA0 of sense amplifier group 232b and two memory cells 206 in each of half of the word lines 202 of the full array mat 203. BLE<0> is further coupled to LIO<2> associated with sense amplifier group 232b. Bit line BLE<1> is coupled to SA1 of sense amplifier group 232b and two memory cells 206 in each of half of the word lines 202 of the full array mat 203. BLE<1> is further coupled to LIO<0> associated with sense amplifier group 232b. Bit line BLE<2> is coupled to SA2 of sense amplifier group 232b and two memory cells 206 in each of half of the word lines 202 of the full array mat 203. BLE<2> is further coupled to LIO<3> associated with sense amplifier group 232b. Bit line BLE<3> is coupled to SA3 of sense amplifier group 232b and two memory cells 206 in each of half of the word lines 202 of the full array mat 203. BLE<3> is further coupled to LIO<1> associated with sense amplifier group 232b.

Turning to the edge mat 205, bit line BLE<0> is coupled to SA0 of sense amplifier group 232a and two memory cells 206 in each of the word lines 202 of the edge mat 205. BLE<0> is further coupled to LIO<2> associated with sense amplifier group 232a. Bit line BLE<1> is coupled to SA1 of sense amplifier group 232a and two memory cells 206 in each of the word lines 202 of the edge mat 205. BLE<1> is further coupled to LIO<1> associated with sense amplifier group 232a. Bit line BLE<2> is coupled to SA2 of sense amplifier group 232a and two memory cells 206 in each of the word lines 202 of the edge mat 203. BLE<2> is further coupled to LIO<3> associated with sense amplifier group 232a. Bit line BLE<3> is coupled to SA3 of sense amplifier group 232a and two memory cells 206 in each of the word lines 202 of the edge mat 205. BLE<3> is further coupled to LIO<1> associated with sense amplifier group 232a.

The coupling of the bit lines 204 to the sense amplifiers and LIO lines in full array mat 203 the 1T region 227 is the same as in the MT region 226. However, each bit line 204 extends to couple to one memory cell 206 in all of the word lines 202 of the full array mat 203. In some embodiments, such as the one shown in FIG. 2, certain portions of the 1T region 227 may include certain sub-portions that have a 2T architecture. For example, as shown in FIG. 2, memory cells 206 in the edge mat 205 may have a folded architecture and coupling arrangement to that of region 226. Further details of folded bit line architectures in edge mats are disclosed in U.S. patent application Ser. No. 17/565,187, which is incorporated herein by reference for any purpose.

In some embodiments, such as the one shown in FIG. 2, the bit lines may be "folded" to couple multiple memory cells 206 together in the region 226. Box 214 shows an enlarged view of the region indicated by box 212. As shown, a bit line 204a extends from SA3 of sense amplifier group 232a and couple memory cell 206a and memory cell 206b.

The bit line 204a may have a "fold" 216a where instead of continuing straight along the mat 203 (such as the bit lines 204 in region 227), the bit line 204a folds back around to couple memory cell 206a and memory cell 206b. Similarly, bit line 204b extends from SA3 of sense amplifier group 232b and has fold 216b to couple memory cells 206c and 206d. In some embodiments, a pitch double process and use of a spacer at the end of the bit line 204 pattern may be used to form the folds 216a and 216b. In the example shown in FIG. 2, the folds 216a, 216b include a straight line extending perpendicularly between two parallel straight line portions of the bit lines 204a and 204b, respectively. However, in other embodiments, the folds 216a, 216b may have a different shape (e.g., curved "U" shape).

In some embodiments, the bit lines coupling the MT memory cells 206 of region 226 may have the same or approximately the same (e.g., within 10%) length as the bit lines coupling the 1T memory cells 206 of region 227. Compared to the sense amplifier groups 234a and 234b in the 1T memory cell region 227, the sense amplifier groups 232a and 232b of the MT memory cell region 227, each sense amplifier group will have only half a section's word lines 202 coupled to it. Two sense amplifiers (e.g., SA0 and SA1) may be used for access. For example, to access the memory cells 206 along WL<n/2+1> in region 226, sense amplifiers of SA0-3 of sense amplifier group 232b are used (but none from sense amplifier group 232a). In contrast, to access the memory cells 206 along WL<n/2+1> in region 227, SA0-3 of sense amplifier group 234a and 234b are used.

In some embodiments, in order to accommodate the fold of the bit lines 204 in memory mat 203 in the region 226, dummy word lines 218 may be included in the memory mat 203. In some embodiments, one dummy word line 218 may be provided. In some embodiments, two to four dummy word lines 218 may be provided. In some embodiments, edge mat 205 may be less crowded than memory mat 203, and dummy word lines 218 may not be necessary to accommodate the folded bit lines 204.

In some embodiments, the increase in layout area due to dummy word lines in the MT region may be less than 1%. In some embodiments, the increase in layout area due to dummy word lines may be approximately 0.27-0.34%.

In some embodiments, providing same-polarity MT memory cells may provide a reduced write recovery time (tWR) for the MT memory cells compared to 1T cells. In some applications, the tWR may be approximately 53% of the tWR of 1T cells.

While same polarity MT architectures provide reduced tWR and acceptably low layout area increases compared to solely 1T memory cell arrays, in some applications, complementary polarity MT architectures may provide further reductions in tWR and/or layout area increases.

Figure 3:
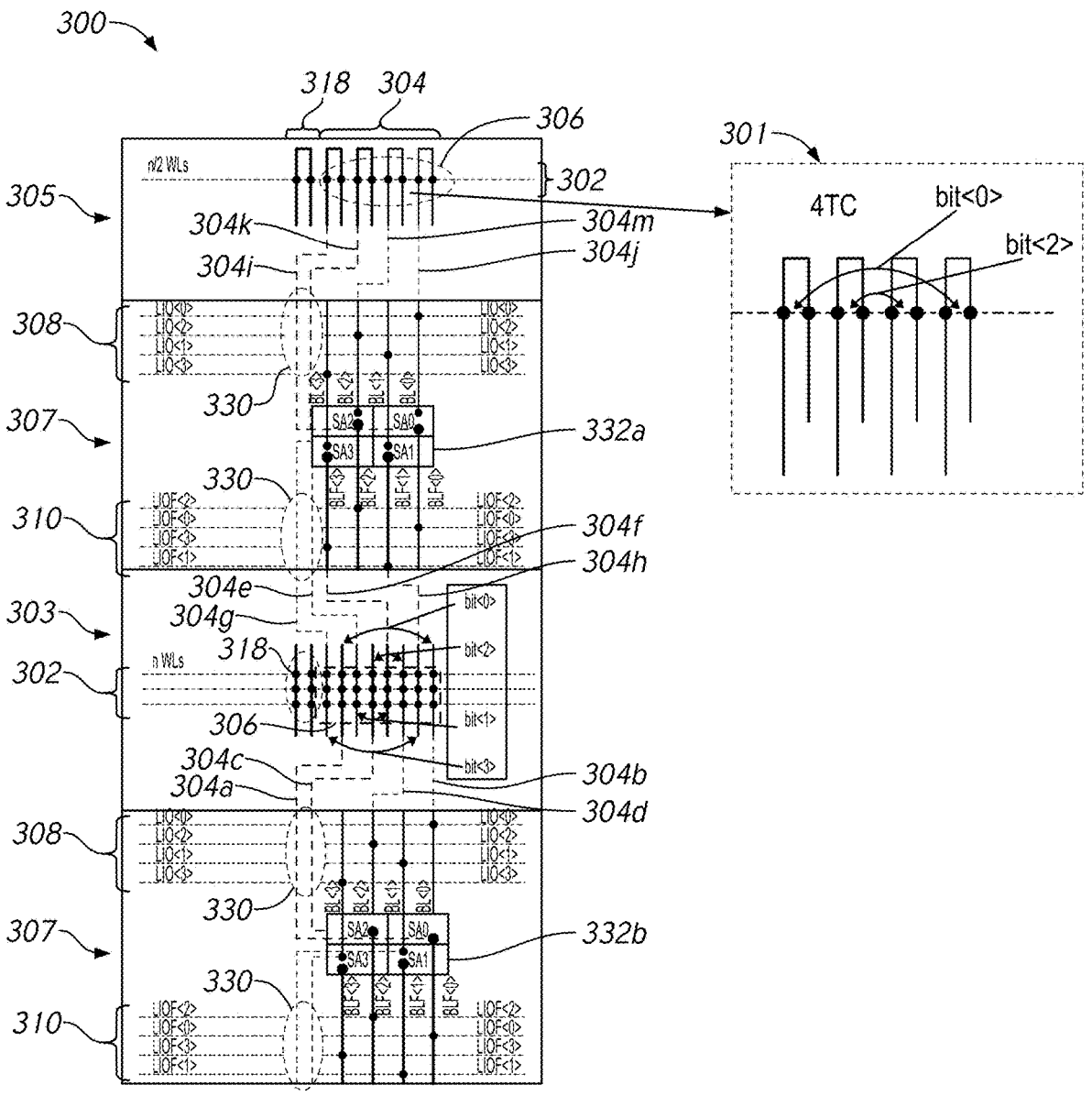
FIG. 3 is a schematic diagram of a portion of a memory array according to at least one embodiment of the present disclosure.

FIG. 3 is a schematic diagram of a portion of a memory array according to at least one embodiment of the present disclosure. The memory array 300 may represent an exemplary portion of a memory array, such as the memory array 118 of FIG. 1. The memory array 300 may be divided into mats, including mat 303 and edge mat 305 (so called because it is at an edge of the memory array 300) separated by peripheral regions 307 that include sense amplifiers (SA) and LIO. The memory array 300 includes a plurality of word lines WL (rows) 302 and bit lines BL/BLF (columns) 304. A plurality of memory cells 306 (MC), are located at the intersection of the rows and columns. A portion of the memory cells 306 along a given word line may be set up using a MT architecture while a remainder of the memory cells along the word line use a 1T architecture in region another region. The memory cells 306 of both MT and 1T be generally similar or identical to each other, except they may be coupled differently as described herein. The region including the 1T architecture may be similar to the architecture shown in region 227 of FIG. 2. Accordingly, the 1T region and explanation thereof are omitted from FIG. 3.

The memory array 300 includes sense amplifier groups 332a and 332b, each of which includes a number of sense amplifiers SA0-3. The sense amplifier groups 332a and 332b may be coupled to local I/O lines LIO 208 and LIOF 210. The sense amplifiers of sense amplifier groups 332a and 332b may be similar or identical to sense amplifiers and groups located in 1T regions (not shown) of the memory array 300, except they may be coupled to memory cells differently as described herein.

For clarity of illustration, only one edge array mat and only one full array mat are shown in FIG. 3. The memory array 300 may include multiple full array mats, with edge array mats at either end of the array. Further, only a few word lines WL and bit lines BL (and their corresponding memory cells 306) and their corresponding sense amplifiers and LIO are shown in FIG. 3. More word lines WL and bit lines BL/BLF (and their corresponding memory cells), sense amplifiers, and LIO may be provided in a memory cell array of the present disclosure.

Each of the memory cells 306 may store information. In some embodiments, the information may be stored as a binary code, in the embodiment shown in FIG. 3, a pair of memory cells 306 in full array mat 303 may store a bit, which may be either at a logical high or a logical low level and four memory cells 306 in an edge mat 305 may store a bit. In the example shown in FIG. 3, the pair of memory cells 306 in the full array mat 303 may have complementary polarities. In the edge mat 305, each pair of memory cells 306 may have a same polarity, but the two pairs of memory cells 306 may have complementary polarities.

The sense amplifiers of sense amplifier groups 332a and 332b may read or write a value of a bit of information along the bit lines 304 to memory cells 206 at the accessed word line 302. The sense amplifiers of sense amplifier groups 332a and 332b may convert a signal along the bit line to a signal which is 'readable' by other elements of the memory device (e.g., by amplifying a voltage). The bit lines may be coupled to an input/output circuit (e.g., input/output circuit 122 of FIG. 1) via a respective column select switch, which may be a column select transistor activated by a column select signal CS. In the example shown in FIG. 3, each CS may access four bits per word line. In the 1T region of the memory array 300 (not shown, see region 227 in FIG. 2), each CS may access eight bits per word line in some embodiments. Thus, the CS in the MT region may access half the number of bits as the CS in the 1T region in some embodiments. The ratio may be different in other embodiments where more memory cells are coupled to the sense amplifiers per sense operation.

In the embodiment shown in FIG. 2, folds in the bit lines were provided with the layout expense of dummy word lines 218 in order to couple the MT memory cells 206 to the sense amplifiers. In contrast, in the embodiment shown in FIG. 3, bit lines BL/BLF and LIO/LIOF are rerouted at the layout expense of dummy bit lines 318 in order to couple the MT memory cells 306 to the sense amplifiers. The routing of the bit lines BL and BLF for the full array mat 303 will be explained with reference to the four pairs of memory cells 306 corresponding to bit<0-3> (a total of eight memory cells 306). Each bit<0-3> is stored by two memory cells 306 having complementary polarities from one another.

A first memory cell 306 of bit<0> may be coupled to bit line 304a, which is routed through an LIO break 330 and coupled to SA0 of sense amplifier group 332b. The routing through the LIO break 330 may be accommodated by the dummy bit lines 318. While two dummy bit lines 318 are used in the example shown in FIG. 3, in other embodiments, more ore fewer dummy bit lines 318 may be used (e.g., 0, 1, 4). A second memory cell 306 of bit<0> may be routed "normally" and coupled to SA0 of sense amplifier group 332b.

A first memory cell 306 of bit<0> may be coupled to bit line 304a, which is routed through an LIO break 330 and coupled to SA0 of sense amplifier group 332b. The routing through the LIO break 330 may be accommodated by the dummy bit lines 318. While two dummy bit lines 318 are used in the example shown in FIG. 3, in other embodiments, more ore fewer dummy bit lines 318 may be used (e.g., 0, 1, 4). A second memory cell 306 of bit<0> may be coupled to bit line 304b which is routed over the LIO and also coupled to SA0 of sense amplifier group 332b.

A first memory cell 306 of bit<2> may be coupled to bit line 304c, which is routed through an LIO break 330 and coupled to SA2 of sense amplifier group 332b. A second memory cell 306 of bit<2> may be coupled to bit line 304d which is routed over the LIO and also coupled to SA2 of sense amplifier group 332b. Thus, in the example shown, the even bits associated with a CS may be associated with the sense amplifiers on a same side of a sense amplifier group.

A first memory cell 306 of bit<1> may be coupled to bit line 304e, which is routed through an LIO break 330 and coupled to SA3 of sense amplifier group 332a. A second memory cell 306 of bit<1> may be coupled to bit line 304f which is routed over the LIO and also coupled to SA3 of sense amplifier group 332a.

A first memory cell 306 of bit<3> may be coupled to bit line 304g, which is routed through an LIO break 330 and coupled to SA1 of sense amplifier group 332a. A second memory cell 306 of bit<3> may be coupled to bit line 304h which is routed over the LIO and also coupled to SA1 of sense amplifier group 332a. Thus, in the example shown, the odd bits associated with a CS may be associated with the sense amplifiers on a same side of a sense amplifier group, similar to the even bits associated with the CS. However, the even bits and odd bits are associated with different sense amplifier groups on opposite sides of the full array mat 303.

Turning to the edge mat 305, the bit lines 304 may be folded, similar to the bit lines 204 in edge mat 205. In this embodiment, the memory cells 306 of the edge mat 305 may have a 4T rather than a 2T structure. That is, four memory cells 306 may be used to store a single bit. Box 301 shows an enlarged view of the memory cells 306 of a word line 302 in the edge mat 305. The curved arrows labeled bit<0> and bit<2> indicate the two pairs of memory cells 306 used to store each bit. The memory cells 306 of edge mat 305 associated with a CS may provide two bits instead of four bits. In some embodiments, the odd bits may be stored in another edge mat (not shown) at the other end of the memory array 300.

Similar to the bits of the full array mat 303, a first pair of memory cells 306 for bit<0> may be coupled to a bit line 304i routed through an LIO break 330 to SA0 of sense amplifier group 332a and a second pair of memory cells 306 for bit<0> may be coupled to a bit line 304j routed over the LIO to couple to SA0 of sense amplifier group 332a. A first pair of memory cells 306 for bit<2> may be coupled to a bit line 304k routed through an LIO break 330 to SA2 of sense amplifier group 332a and a second pair of memory cells 306 for bit<2> may be coupled to a bit line 304m routed over the LIO to couple to SA2 of sense amplifier group 332a.

Returning to the sense amplifiers, SA0 of sense amplifier group 332a is coupled to LIO<0> by BL<0> and to LIOF<0> by BLF<0>, which is a truncated portion of a bit line that in a 1T region, would have extended into the array mat 303. SA2 is coupled to LIO<2> by BL<2> and LIOF<2> by BLF<2>, which is again a truncated portion of a bit line that in a 1T region, would have extended into the array mat 303. SA1 of sense amplifier group 332a is coupled to LIOF<1> by BLF<1> and to LIO<1> by BL<1>, which is a truncated portion of a bit line that in a 1T region, would have extended into the edge mat 305. SA3 is coupled to LIOF<3> by BLF<3> and LIO<3> by BLF<3>, which is again a truncated portion of a bit line that in a 1T region, would have extended into the edge mat 303. The sense amplifiers of sense amplifier group 332b have a corresponding coupling structure between the bit lines 304 and the LIO lines 308, 310. Thus, "original" portions of the bit lines rerouted through the LIO break 330 may be "preserved" for coupling to LIO lines 308, 310.

Comparing the sense amplifier groups 234a and 234b in 1T region 227 shown in FIG. 2, for each sense amplifier SA0-3 of the sense amplifier groups 332a and 332b in the MT region of memory array 300, both BL and BLF are at a same side of the SA compared to the 1T array region where the BL and BLF are at different sides of the SA. Further, each full mat 303 in the MT region only uses half of the sense amplifiers from odd and even SA for the 2T example shown in FIG. 3. In some embodiments, such as the one shown, the original jump over bit lines may be routed to the opposite CS region, but may be truncated before entering a core of a memory array mat.

In some embodiments, two of the four bit lines may be placed on a metal M0 layer of a die and the other two bit lines may be routed off diffusion Li1 layer. For example, the bit lines routed through the LIO breaks 330 may be disposed on the metal M0 layer and the bit lines routed over the LIO/F lines may be routed off diffusion Li1 layer in some embodiments. In some embodiments, the diffusion layer may be adjacent to the metal layer.

The embodiment shown in FIG. 3 provides for one column select CS. However, in some applications, more than one column select in a column plane may be desired.

Figure 4:
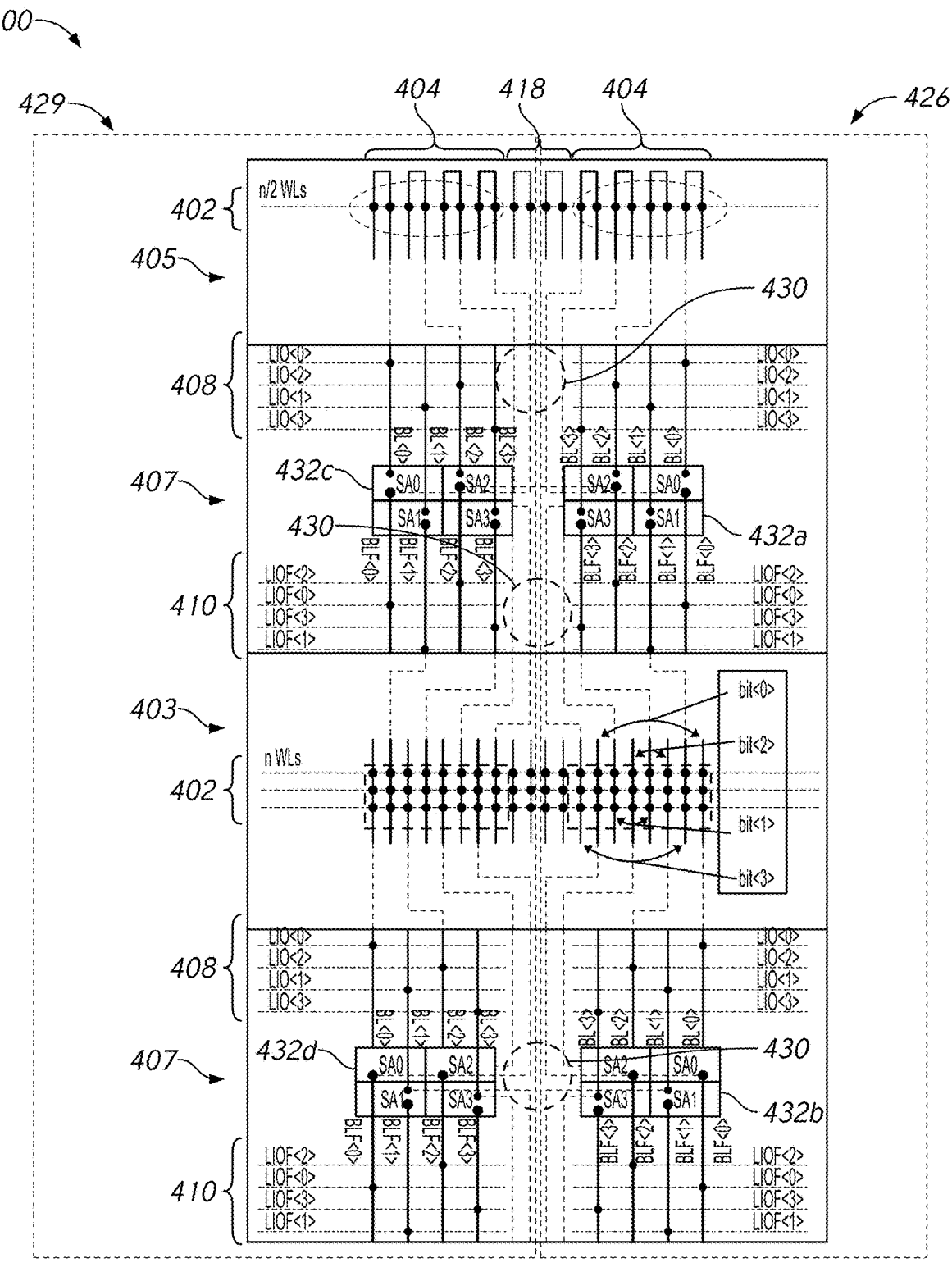
FIG. 4 is a schematic diagram of a portion of a memory array according to at least one embodiment of the present disclosure.

FIG. 4 is a schematic diagram of a portion of a memory array according to at least one embodiment of the present disclosure. The memory array 400 may represent an exemplary portion of a memory array, such as the memory array 118 of FIG. 1. The memory array 400 may be divided into mats, including mat 403 and edge mat 405 (so called because it is at an edge of the memory array 400) separated by peripheral regions 407 that include sense amplifiers (SA) and LIO. The memory array 400 includes a plurality of word lines WL (rows) 402 and bit lines BL/BLF (columns) 404. A plurality of memory cells 406 (MC), are located at the intersection of the rows and columns. A portion of the memory cells 406 along a given word line may be set up using a MT architecture while a remainder of the memory cells along the word line use a 1T architecture in region another region. The memory cells 406 of both MT and 1T be generally similar or identical to each other, except they may be coupled differently as described herein. The region including the 1T architecture may be similar to the architecture shown in region 227 of FIG. 2. Accordingly, the 1T region and explanation thereof are omitted from FIG. 4.

The memory array 400 includes sense amplifier groups 432a-d, each of which includes a number of sense amplifiers SA0-3. The sense amplifier groups 432a-d may be coupled to local I/O lines LIO 408 and LIOF 410. The sense amplifiers of sense amplifier groups 432a-d may be similar or identical to sense amplifiers and groups located in 1T regions (not shown) of the memory array 300, except they may be coupled to memory cells differently as described herein.

For clarity of illustration, only one edge array mat and only one full array mat are shown in FIG. 4. The memory array 400 may include multiple full array mats, with edge array mats at either end of the array. Further, only a few word lines WL and bit lines BL (and their corresponding memory cells 406) and their corresponding sense amplifiers and LIO are shown in FIG. 4. More word lines WL and bit lines BL/BLF (and their corresponding memory cells), sense amplifiers, and LIO may be provided in a memory cell array of the present disclosure.

Region 426 of memory array 400 on one side of the LIO break 430 may be associated with one column select signal and region 429 on the other side of the LIO break 430 may be associated with another column select signal. In some embodiments, only one column select may be associated on a side of an LIO break 430. The layout and operation of region 426 may be substantially the same as the portion of memory array 300 shown in FIG. 3. The operation of region 429 may be substantially the same as the operation of region 426 and the portion of memory array 300 shown in FIG. 3. However, the layout of the region 429 may be a mirror image of the layout of region 426.

In some embodiments, such as the one shown in FIG. 4, compared to memory array 300, additional dummy bit lines 418 may be provided in memory array 400 to accommodate the routing of the bit lines 404 through the LIO break 430. In the example shown, four dummy bit lines 418 are provided. However, in other embodiments, more or fewer dummy bit lines 418 may be provided.

In some embodiments, 16 bits are required to provide adequate storage for the access count Xcount. For the MT arrangement shown in FIGS. 3 and 4, four column selects may be used to access the 16 bits (e.g., one column select accesses eight memory cells and 4 bits per memory cell in full array mats). Various layouts may be used to accommodate MT memory cells and column selects used to store the Xcount. For example, memory cells for two column selects may be located in a column plane associated with error correction code and global column redundancy. In some embodiments, the two column selects associated with the Xcount may use the layout shown in FIG. 4. Memory cells for a third column select associated with the Xcount may be placed in another column plane, and memory cells for a fourth column select associated with the Xcount may be placed in a separate column plane. For example, the other two column planes may be associated with DQ3 and DQ4. In another example, the other two column planes may be associated with DQ1 and DQ2. Other column planes may be used in other examples.

In some embodiments, the increase in layout area due to dummy bit lines may be less than 1%. In some embodiments, the increase in layout area due to dummy bit lines may be approximately 0.23%. In some embodiments, this layout area penalty is less than the layout penalty for dummy word lines.

In some embodiments, providing complementary-polarity MT memory cells may provide a reduced write recovery time (tWR) for the MT memory cells compared to 1T cells.

In some applications, the tWR may be approximately 47% of the tWR of 1T cells. In some embodiments, the complementary-polarity MT memory cells may provide a lower tWR than same-polarity MT memory cells.

While folding bit lines as described with reference to FIG. 2 and rerouting bit lines as described with reference to FIGS. 3 and 4 provide minimal layout penalties for incorporating MT architecture into the same array as 1T cells, in some applications, these techniques may increase layout complexity and/or increase the risk of defects. Depending on various factors, such as processing equipment, process type, and/or desired robustness against defects, other techniques may be desirable, even if the layout penalty may be higher in some cases.

Figure 5A:
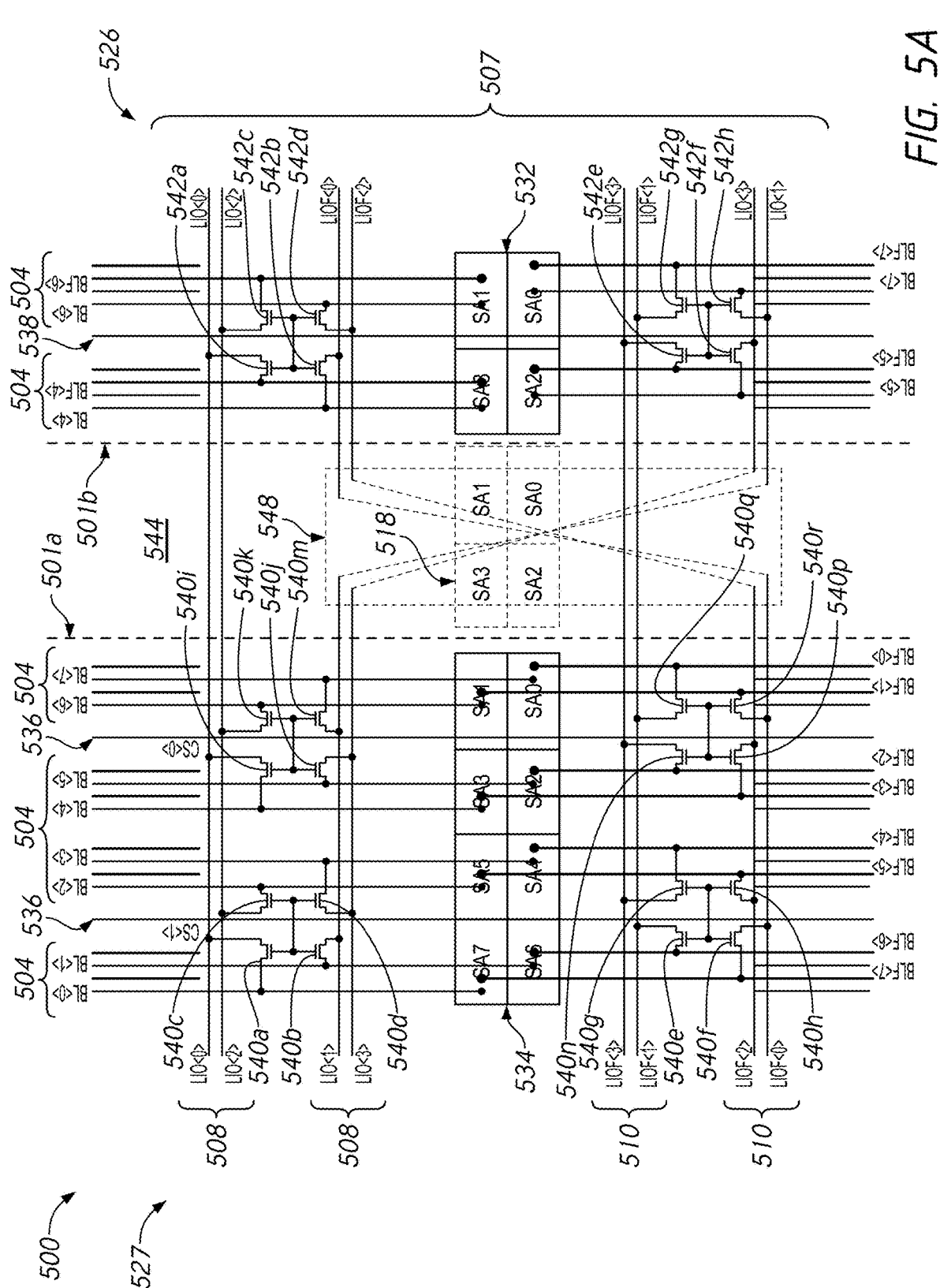
FIG. 5A is a schematic diagram of a portion of a memory array according to at least one embodiment of the present disclosure.

FIG. 5A is a schematic diagram of a portion of a memory array according to at least one embodiment of the present disclosure. The memory array 500 may represent an exemplary portion of a memory array, such as the memory array 118 of FIG. 1. While memory array 500 may include one or multiple memory mats including memory cells and word lines as shown in FIG. 1, only a peripheral region 507 of memory array 500 is shown in FIG. 5. Memory array 500 may include multiple peripheral regions that are substantially the same as peripheral region 507 in some embodiments. Furthermore, while only a few bit lines, sense amplifiers, and LIO are shown for clarity, more or fewer lines BL, LIO, and sense amplifiers may be included in memory array 500 in some embodiments.

A portion of the memory cells (not shown) of memory array 500 along a given word line may have a MT architecture, such as in MT region 526 on the right side (from the perspective of the reader) of line 501b. The MT architecture may use memory cell having a same polarity or complementary polarity. A remainder of the memory cells along the word line use a 1T architecture in region 527 on the left side of line 501a. The memory cells of both regions 526 and 527 may be generally similar or identical to each other, except they may be coupled differently as described herein. The memory array 500 includes a number of sense amplifier groups 532 and 534, each of which includes a number of sense amplifiers SA0-3 and SA0-7, respectively. The sense amplifier groups 532 and 534 may be generally similar to each other, except that the sense amplifier group 534 are coupled to bit lines in the 1T region, and the sense amplifier group 532 are coupled to bit lines in the MT region 526. The sense amplifier groups 532 and 534 may be coupled to local I/O lines LIO 508 and LIOF 510.

Column selects 536 and 538 may provide CS signals (e.g., CS<0> and CS<1>) to column select switches 540 and 542, respectively, which may be implemented by transistors, as shown in FIG. 5. The switches 540 and 542 may be controlled by the CS signals to activate corresponding sense amplifiers of the sense amplifier groups 532 and 534. In some embodiments, sense amplifier group 534 may include two sense amplifier groups (e.g., SA0-3 and SA4-7).

Turning to the 1T region 227, a first group of CS switches 540 associated with CS<1> is coupled to the LIO lines <0-3> and bit lines BL<0-7>. Switch 540a is coupled between LIO<0> and BL<0>. Switch 540b is coupled between LIO<1> and BL<1>. Switch 540c is coupled between LIO<2> and BL<2> and switch 540d is coupled between LIO<3> and BL<3>.

A second group of CS switches 540 associated with CS<1> is coupled to the LIOF lines <0-3> and bit lines BLF<4-7>. Switch 540e is coupled between LIOF<1> and BLF<6>. Switch 540f is coupled between LIOF<0> and BLF<7>. Switch 540$g$ is coupled between LIOF<3> and BLF<4>. Switch 540$h$ is coupled between LIOF<2> and BLF<5>.

A first group of CS switches 540 associated with CS<0> is coupled to the LIO lines <0-3> and bit lines BL<4-7>. Switch 540$i$ is coupled between LIO<0> and BL<4>. Switch 540$j$ is coupled between LIO<3> and BL<5>. Switch 540$k$ is coupled between LIO<2> and BL<6> and switch 540$m$ is coupled between LIO<1> and BL<7>.

A second group of CS switches 540 associated with CS<0> is coupled to the LIOF lines <0-3> and bit lines BLF<0-3>. Switch 540$n$ is coupled between LIOF<3> and BLF<2>. Switch 540$p$ is coupled between LIOF<2> and BLF<3>. Switch 540$q$ is coupled between LIOF<1> and BLF<0>. Switch 540$r$ is coupled between LIOF<0> and BLF<1>.

As for the bit lines, BL<0> is coupled to SA7, BL<1> is coupled to SA6, BL<2> is coupled to SA 5, BL<3> is coupled to SA4, BL<4> is coupled to SA3, BL<5> is coupled to SA2, BL<6> is coupled to SA1, and BL<7> is coupled to SA0 of sense amplifier group 534. BLF<7> is coupled to SA7, BLF<6> is coupled to SA6, BLF<5> is coupled SA5, BLF<4> is coupled to SA4, BLF<3> is coupled to SA3, BLF<2> is coupled to SA2, BLF<1> is coupled to SA1, and BLF<0> is coupled to SA0 of sense amplifier group 534. The coupling of the bit lines, sense amplifiers, and column select switches in the 1T region 527 may allow eight bits to be accessed per column select.

Turning to the MT region 526, which in the example shown in FIG. 5 is a 2T architecture, compared to the 1T region 527, LIOF<0> and LIOF<2> have been shifted to be on an opposite side of the sense amplifier group 532 to sense amplifier group 534. In both regions, LIOF<2> is disposed closer to the sense amplifiers. Similarly, LIO<1> and LIO<3> in the MT region 526 are an opposite side of the sense amplifier group 532 compared to sense amplifier group 534 in the 1T region 527, and LIO<3> is disposed closer to the sense amplifiers in both regions. As shown in region 544 between lines 501$a$ and 501$b$, the LIO lines for LIO<1> and LIO<3> and LIOF<0> and LIOF<2> "twist" to accommodate the altered routing. LIO<1> and LIO<3> extend from an "upper" (from the perspective of the viewer) portion to a "lower" portion of the memory array 500 as well as switch which of the two LIO line is closer to the upper portion of the memory array 500. Similarly, LIOF<0> and LIOF<2> extend from the lower portion of the memory array 500 to the upper portion and switch which of the two LIO lines is closer to the lower portion of the memory array 500. In some embodiments, in the region 544, there may be a break in the horizontal metal layer to allow an upper metal layer to provide the twist 548 of the LIO lines. In some embodiments, the twist 548 may allow a typical IO break 531 in the column plane.

A first group of CS switches 542 associated with CS<0> of column select 538 is coupled to the LIO lines LIO<0,2> and LIOF<0,2> and bit lines BL<4,6> and BLF<4,6>. Switch 542$a$ is coupled to LIO<0> and BLF<4> and switch 542$b$ is coupled to LIOF<0> and BL<4>. Switch 542$c$ is coupled to LIO<2> and BLF<6> and switch 542$d$ is coupled to LIOF<2> and BL<6>.

A second group of CS switches 542 associated with CS<0> of column select 538 is coupled to the LIO lines LIO<1,3> and LIOF<1,3> and bit lines BL<5,7> and BLF<5,7>. Switch 542$e$ is coupled to LIOF<3> and BLF<5> and switch 542$f$ is coupled to LIO<3> and BL<5>. Switch 542$g$ is coupled to LIOF<1> and BLF<7> and switch 542$h$ is coupled to LIO<1> and BLF<7>.

Bit lines BL<4> and BLF<4> are both coupled to SA3, and BL<6> and BLF<6> are both coupled to SA1. Bit lines BL<5> and BLF5> are both coupled SA2, and BL<7> and BLF<7> are both coupled to SA0 of sense amplifier group 532. Thus, BL and BLF bit lines are on both sides of the sense amplifier group 532 in MT region 526, whereas in the 1T region 527, all of the BL lines are on one side of sense amplifier group 534 and all of the BLF lines are on a different side of sense amplifier group 534. The coupling of the bit lines, sense amplifiers, and column select switches in the MT region 526 may allow four bits stored in eight memory cells (e.g., one bit stored in a pair of memory cells) to be accessed per column select in the MT region 526.

Figure 5B:
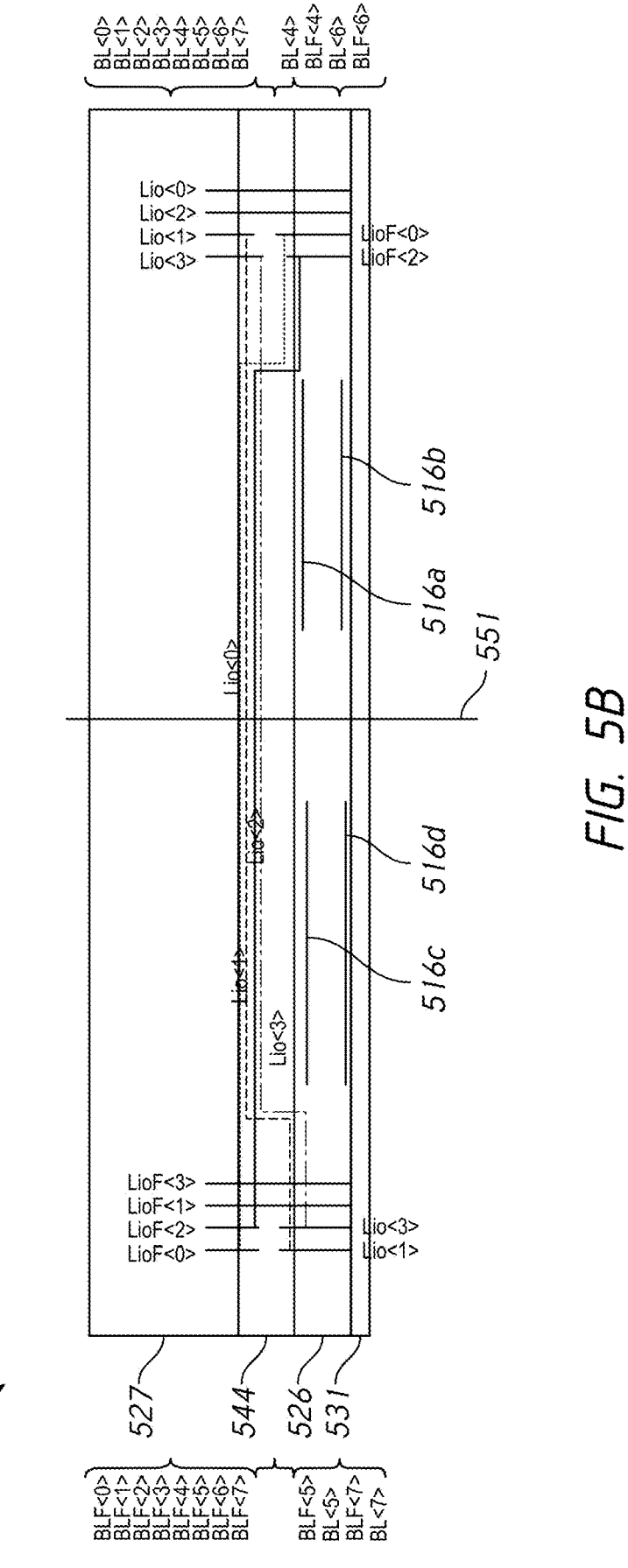
FIG. 5B is a schematic diagram of a sub-portion of the memory array shown in FIG. 5A according to at least one embodiment of the present disclosure.

For four bits encoded in the MT region 526, certain bit lines may be folded. FIG. 5B is a schematic diagram of a sub-portion of the memory array shown in FIG. 5A according to at least one embodiment of the present disclosure. The sub-portion 500B shows an example die layout of twist 548 in region 544. It also illustrates an example of the folded bit lines in the MT region 526. Midline 551 indicates a middle of memory array 500 from top (e.g., top of the page from the perspective of the viewer) and the bottom. In some embodiments, half of the sense amplifiers of a sense amplifier group may above the midline 551 and the other half may be below the midline 551. In the example shown in FIG. 5B, BLF<4> and BLF<6> are folded back toward the "top" of memory array 500 as indicated by folds 516$a$ and 516$b$, respectively, rather than extending beyond midline 551. BL<5> and BL<7> are folded back toward the "bottom" of memory array 500 as indicated by folds 516$c$ and 516$d$, respectively, rather than extending beyond midline 551.

The twist 548 of the LIO lines along with the rearranging of the BL and BLF lines between the MT and 1T regions may allow a same connection at the column selects. Which LIO lines are twisted depends on the bit line to LIO coupling difference between the MT region 526 and 1T region 527 of the array 500. In some embodiments, the LIO lines may be twisted at both ends of the MT region 526. For example, there may be 1T regions 527 on either side of the MT region 526, and there may be a region 544 on either end of the MT region 526. The twist 548 may not require dummy bit lines and/or dummy word lines. Further, the bit lines may not require extending compared to other layout techniques. However, in some embodiments, the twist 548 may use a width equal to or approximately (e.g., within 10%) the width of a sense amplifier group including four sense amplifiers as indicated by the "dummy" sense amplifier group 518 shown in FIG. 5.

While the embodiments shown in FIGS. 2-5 provide routing techniques for bit lines and LIO lines to facilitate MT and 1M memory cells in a memory array, modifications can be made to other components of the memory as well, either in addition to or instead of the previously described techniques. For example, for MT memory cells, since multiple memory cells store a bit, fewer connections between bit lines and LIO lines may be required compared to 1T memory cells. In some applications, this may allow larger sense amplifiers to be used in the MT region of the memory array compared to the sense amplifiers used in the 1T region of the memory array. In some embodiments, this may reduce or eliminate any layout increase penalties for integrating MT and IT regions in a same memory array.

Figure 6:
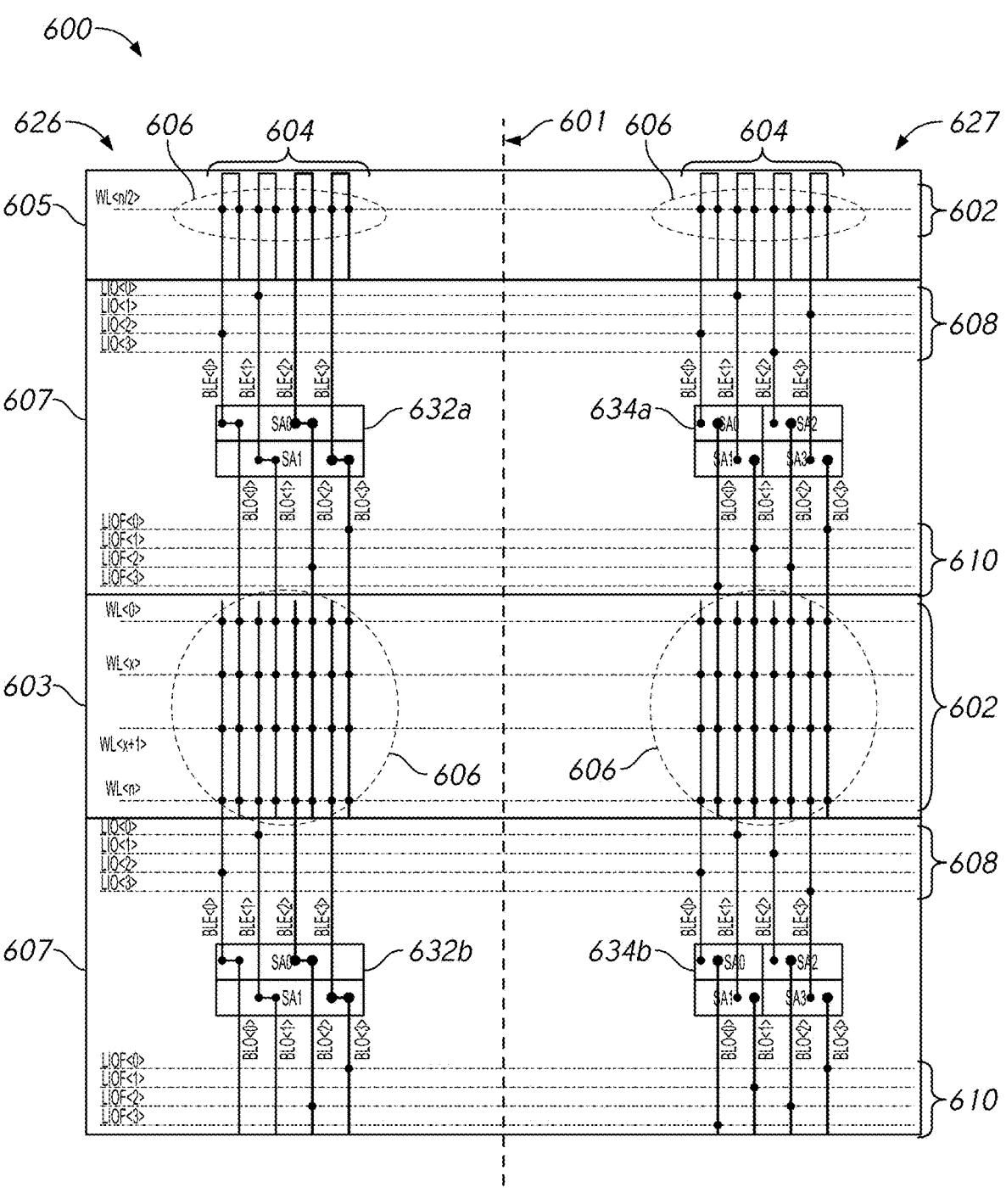
FIG. 6 is a schematic diagram of a portion of a memory array according to at least one embodiment of the present disclosure.

FIG. 6 is a schematic diagram of a portion of a memory array according to at least one embodiment of the present disclosure. The memory array 600 may represent an exemplary portion of a memory array, such as the memory array 118 of FIG. 1. The memory array 600 may be divided into mats, including mat 603 and edge mat 605 separated by peripheral regions 607 that include sense amplifiers (SA) and LIO. The memory array 600 includes a plurality of word lines WL (rows) 602 and bit lines (BLE and BLO) (columns) 604. A plurality of memory cells 606 (MC), are located at the intersection of the rows and columns. A portion of the memory cells 606 along a given word line may be set up using a MT architecture, such as in MT region 626 on the left side (from the perspective of the reader) of line 601, while a remainder of the memory cells along the word line use a 1T architecture in region 627 on the right side of line 601. The memory cells 606 of both regions 626 and 627 may be generally similar or identical to each other, except they may be coupled differently as described herein.

The memory array 600 includes a number of sense amplifier groups 632*a-b* and 634*a-b*. In contrast to other embodiments, the sense amplifier groups 632*a-b* are different than the sense amplifier groups 634*a-b*. The sense amplifier groups 634*a-b* each include four sense amplifiers SA0-3. The sense amplifier groups 632*a-b* each include two sense amplifiers SA0 and SA1. However, the sense amplifiers SA0 and SA1 of sense amplifier group 632*a-b* are double the size of the sense amplifiers SA0-3 of sense amplifier groups 634*a-b*. The sense amplifier groups 632*a-b* and 634*a-b* may be coupled to local I/O lines LIO 608 and LIOF 610.

For clarity of illustration, only one edge array mat and only one full array mat are shown in FIG. 6. The memory array 600 may include multiple full array mats, with edge array mats at either end of the array. Further, only a few word lines WL and bit lines BL (and their corresponding memory cells 606) and their corresponding sense amplifiers and LIO are shown in FIG. 6. More word lines WL and bit lines BL (and their corresponding memory cells), sense amplifiers, and LIO may be provided in a memory cell array of the present disclosure.

Each of the memory cells 606 may store information. In some embodiments, the information may be stored as a binary code, and each memory cell 206 in the MT region may store a bit, while a pair of memory cells 206 in the MT region 226 may store a bit, which may be either at a logical high or a logical low level. In the example shown in FIG. 2, the pair of memory cells 206 in the MT region 226 may have a complementary polarity. Certain memory cells along each of the word lines may be set up as MT memory cells in region 626. In the example shown in FIG. 6, the MT memory cells have a 2T architecture. The 2T memory cells 606 in region 626 may generally be similar to the other, 1T, memory cells of region 627. In some embodiments, the 2T memory cells of region 626 may be physically the same as the other memory cells 606.

In the MT region 626, for the full array mat 603, memory cells 606 coupled to BLO<0> and BLO<2> are coupled to SA0 of sense amplifier group 632*a*, and memory cells 606 coupled to BLO<1> and BLO<3> are coupled to SA1 of sense amplifier group 632*a*. The memory cells 606 coupled to BLE<0> and BLE<2> are coupled to SA0 of sense amplifier group 632*b*, and memory cells 606 coupled to BLE<1> and BLE<3> are coupled to SA1 of sense amplifier group 632*b*. BLO<2> is further coupled to LIOF<2> and BLO<3> is coupled to LIOF<0> associated with sense amplifier group 632*a*. BLO. BLE<0> is further coupled to LIO<2> and BLE<1> is further coupled to LIO<1> associated with sense amplifier group 632*b*. Note also that some memory cells and bit lines from another full array mat 603 are coupled in a similar manner to the sense amplifiers of sense amplifier group 632*b* and associated LIOF lines.

For the edge mat 605, memory cells 606 coupled to BLE<0> and BLE<2> are coupled to SA0 of sense amplifier group 632*a* and BLE<1> and BLE<3> are coupled to SA1 of sense amplifier group 632*a*. BLE<0> is further coupled to LIO<2> and BLE<1> is coupled to LIO<1> associated with sense amplifier group 632*a*. Note that similar to the embodiment shown in FIG. 2, the bit lines 604 are folded in the edge mat 605 and couple two memory cells 606.

The coupling between the memory cells 606, bit lines 604, sense amplifiers, and LIO lines 608, 610 in the 1T region 627 may be generally the same as the coupling shown in 1T region 227 shown in FIG. 2.

In addition to the sense amplifiers of the sense amplifier groups 632*a-b* being twice the size of the sense amplifiers of sense amplifier groups 634*a-b*, the bit line lengths are double compared to the bit line lengths in the 1T region 627. In contrast to the embodiment shown in FIG. 2, rather than have each bit line 604 coupled to multiple memory cells 606 per word line 602, each bit line 604 is coupled to memory cells 606 in multiple word lines 602. In the example shown in FIG. 6, the word lines 602 that include the memory cells 606 coupled to a same bit line 204 are in different memory mats 605, 603. However, the bit lines 604 couple to the LIO on one side of a sense amplifier group. Two LIO/LIOF pairs are used for each sense amplifier group in the MT region 626, whereas four LIO/LIOF pairs are used in the 1T region 627 and in both the MT and 1T regions of the embodiment shown in FIG. 2.

When reading four bits (eight memory cells 606) in MT region 626, all sense amplifiers in sense amplifier groups 632*a* and 632*b* may be activated, each sense amplifier accessing one bit (two memory cells 606). In some embodiments, the drive and/or loading of the MT region 626 may be double compared to the 1T region. However, there is little to no increase in layout size, and the tWR of the MT region 626 is approximately 47% of the tWR of the 1T region 627, similar in performance to the embodiment shown in FIGS. 3-4.

Various techniques for incorporating both 1T and MT memory cells in a memory array have been disclosed. The various embodiments may provide MT memory cells with reduced access times compared to 1T cells and low increases in layout area without requiring difference processes between the 1T and MT regions of the memory array.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a first sense amplifier group comprising four sense amplifiers;

a second sense amplifier group comprising four sense amplifiers, wherein two of the four sense amplifiers in the first sense amplifier group and two of the four sense amplifiers in the second sense amplifier group are configured to be activated during a sense operation and individual ones of the sense amplifiers is configured to sense one of a first plurality of memory cells during the sense operation;

a third sense amplifier group comprising two sense amplifiers; and a fourth sense amplifier group comprising two sense amplifiers, wherein all of the sense amplifiers of the third and fourth sense amplifier groups are configured to be activated during a sense operation and individual ones of the sense amplifiers is configured to sense at least two of a second plurality of memory cells during the sense operation.

2. The apparatus of claim 1, wherein the at least two of the second plurality of memory cells sensed by a sense amplifier of the third or fourth sense amplifier group have complementary polarities.

3. The apparatus of claim 1, wherein the first plurality of memory cells and the second plurality of memory cells are disposed in a memory mat, wherein the first sense amplifier group and the third sense amplifier group are located in a first peripheral region on a first side of the memory mat and the second sense amplifier group and the fourth sense amplifier group are located in a second peripheral region on a second side of the memory mat.

4. The apparatus of claim 3, wherein a first plurality of bit lines coupled to the second plurality of memory cells and to the third sense amplifier group extend from the memory mat across the first peripheral region to a second memory mat.

5. The apparatus of claim 3, wherein a second plurality of bit lines coupled to the second plurality of memory cells and to the fourth sense amplifier group extend from the memory mat across the second peripheral region to a third memory mat.

6. The apparatus of claim 5, wherein the third memory mat is an edge mat.

7. The apparatus of claim 5, wherein the second plurality of bit lines have a length double a length of a third plurality of bit lines coupled to the first sense amplifier group.

8. The apparatus of claim 1, wherein the sense amplifiers of the third and fourth sense amplifier groups are double a size of the sense amplifiers of the first and send sense amplifier groups.

9. The apparatus of claim 1, wherein four pairs of LIO lines are coupled to the first sense amplifier group and the second sense amplifier group and two pairs of LIO lines are coupled to the third sense amplifier group and the fourth sense amplifier group.

10. The apparatus of claim 1, wherein the first plurality of memory cells are configured to store data and the second plurality of memory cells are configured to store access count values for a word line.

* * * * *